(12) United States Patent
Kim et al.

(10) Patent No.: US 8,522,115 B2
(45) Date of Patent: Aug. 27, 2013

(54) FLASH MEMORY DEVICE AND MEMORY SYSTEM COMPRISING SAME

(75) Inventors: Ju hyung Kim, Yongin-si (KR); Chang Seok Kang, Seongnam-si (KR); Young Woo Park, Seoul (KR); Jung Dal Choi, Hwaseong-si (KR); Jong-Yeon Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 310 days.

(21) Appl. No.: 12/898,843

(22) Filed: Oct. 6, 2010

(65) Prior Publication Data

US 2011/0119564 A1 May 19, 2011

(30) Foreign Application Priority Data

Nov. 16, 2009 (KR) .................. 10-2009-0110473

(51) Int. Cl.
*G11C 29/00* (2006.01)

(52) U.S. Cl.
USPC ...................................... 714/773; 365/185.17

(58) Field of Classification Search
USPC ..................................... 714/773; 365/185.17
See application file for complete search history.

(56) References Cited

U.S. PATENT DOCUMENTS

| | | | |
|---|---|---|---|
| 2006/0139997 A1* | 6/2006 | Park et al. | 365/185.2 |
| 2008/0137422 A1* | 6/2008 | Hosono | 365/185.17 |
| 2008/0244211 A1 | 10/2008 | Ito | |
| 2009/0070523 A1 | 3/2009 | Kim et al. | |
| 2009/0244967 A1* | 10/2009 | Kim et al. | 365/185.2 |
| 2010/0246255 A1* | 9/2010 | Shiino et al. | 365/185.2 |

FOREIGN PATENT DOCUMENTS

| | | |
|---|---|---|
| JP | 2001109666 A | 4/2001 |
| JP | 2008090519 A | 4/2008 |
| JP | 2009054275 A | 3/2009 |
| KR | 1020090021508 A | 3/2009 |

* cited by examiner

*Primary Examiner* — Guy Lamarre
(74) *Attorney, Agent, or Firm* — Voletine & Whitt, PLLC

(57) ABSTRACT

A flash memory device provided here comprises a user data area storing user data; and a security data area storing security data. The security data area stores a security data pattern in which first groups of memory cells storing security data are arranged respectively between second groups of memory cells storing dummy data.

18 Claims, 14 Drawing Sheets

FLASH MEMORY DEVICE AND MEMORY SYSTEM COMPRISING SAME

CROSS-REFERENCE TO RELATED APPLICATIONS

This U.S. non-provisional patent application claims priority under 35 U.S.C. §119 of Korean Patent Application No. 10-2009-0110473, filed on Nov. 16, 2009, the entire contents of which are hereby incorporated by reference.

BACKGROUND OF THE INVENTIVE CONCEPT

The present disclosure herein relates to flash memory devices.

Generally, semiconductor memories are a vital microelectronic device in digital logic systems such as computers and microprocessor-based applications ranging from satellites to consumer electronics. Thus, an advance in a manufacturing technology of a semiconductor memory including a process improvement and a technology development obtained through a scaling for a high integration and a high speed is helpful to establish performance standards of different digital logic families.

Semiconductor memory devices are classified into volatile semiconductor memory devices and nonvolatile semiconductor memory devices. In volatile semiconductor memory devices, logic information is stored by setting a logic state of bistable flip-flop in case of a static random access memory (SRAM) and by charging a capacitor in case of a dynamic random access memory (DRAM). In case of volatile semiconductor memory devices, data is stored and read in and from them while a power is applied, but data is lost when the power is interrupted.

Nonvolatile semiconductor memory devices such as MROM, PROM, EPROM, EEPROM or the like can store data even when a power is interrupted. Nonvolatile memory data storage states are permanent or reprogrammable according to a manufacturing technology. Nonvolatile semiconductor memory devices are used for program and microcode storage in a wide range of application such as a computers, avionics, telecommunications, and user electronics. A combination of volatile and nonvolatile memory storage modes in a single chip is also available in devices like a nonvolatile RAM (nvRAM) devices. The devices are used in systems requiring a nonvolatile memory that is fast and reprogrammable. Furthermore, there has been developed a specific memory structure including additional logic circuits to optimize performance for application-oriented work.

In nonvolatile semiconductor memory devices, MROM, PROM and EPROM are not readily writeable or erasable by system itself, so it is not easy for users to update the memory contents. On the contrary, EPPROM can be electrically writeable and erasable, so it is applied into auxiliary memory devices or system programming memories which need continuous update.

As an example of nonvolatile memory devices, a flash memory device is a kind of EEPROM that a plurality of memory areas is erased or programmed by one program operation. In a general EEPROM, only one memory area can be erased or programmed at one time. This means that when systems using a flash memory device read and write with respect to different memory areas at the same time, a flash memory device can operate at a higher and effective speed. All types of flash memory and EEPROM are worn out after the specific number of erasing operations due to an abrasion of an insulating layer surrounding a charge storage means used to store data.

SUMMARY OF THE INVENTIVE CONCEPT

Embodiments of the inventive concept provide a flash memory device. The flash memory device may include a user data area storing user data; and a security data area storing security data, wherein the security data area stores a security data pattern in which first groups of memory cells storing security data are arranged between second groups of memory cells storing dummy data, respectively.

Embodiments of the inventive concept also provide a memory system. The memory system may include a flash memory device including a user data area and a security data area; and a controller including a first error correction unit which is configured to detect and correct an error of user data stored in the user data area and a second error correction unit which is configured to detect and correct an error of security data stored in the security data area. An error correction ability of the second error correction unit is greater than an error correction ability of the first error correction unit.

Embodiments of the inventive concept also provide a security data program method of a flash memory device. The method may include defining a user data area and a security data area; and storing a security data pattern in the security data area. The security data area comprises first memory cells storing security data and second memory cells storing dummy data, and the security data pattern is stored in the first memory cells of the security data area so as to be surrounded by the second memory cells.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF THE EMBODIMENTS

Figure 1:
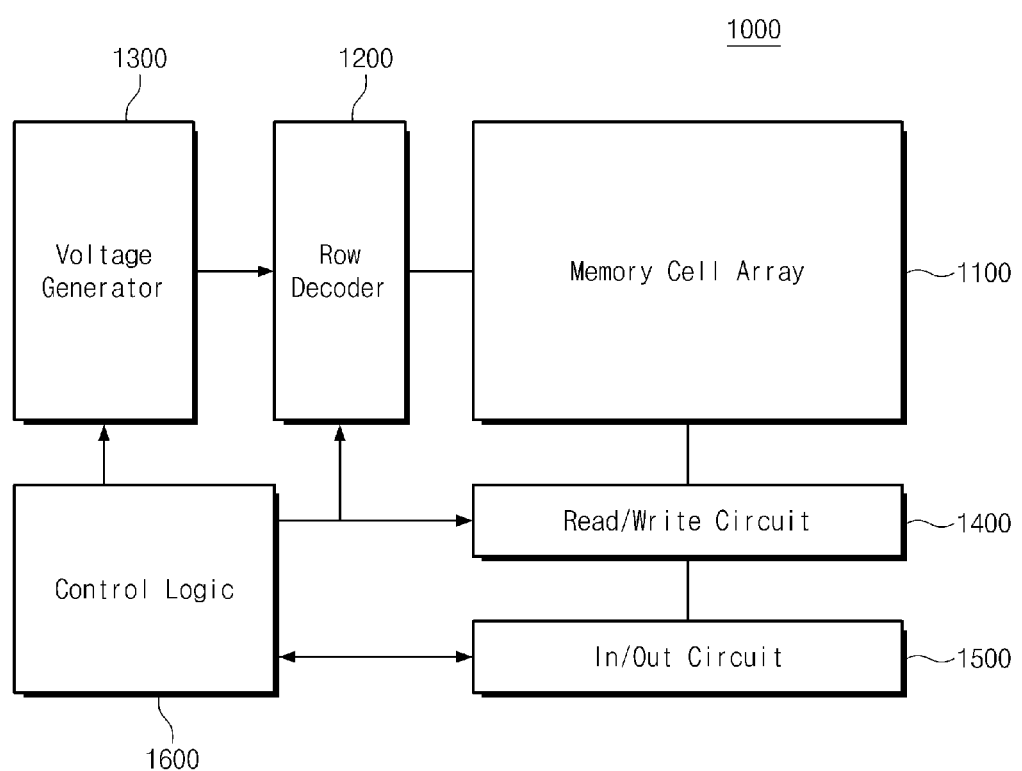
FIG. 1 is a block diagram illustrating a flash memory device in accordance with an exemplary embodiment of the present inventive concept.

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

In the drawings, the thickness of layers and regions are exaggerated for clarity. It will be understood that when an element is referred to as being "connected" or "coupled" to another element, it can be directly connected or coupled to the other element or intervening elements may be present. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

FIG. 1 is a block diagram illustrating a flash memory device in accordance with an exemplary embodiment of the present inventive concept.

Referring to FIG. 1, a flash memory device 1000 includes a memory cell array 1100 storing data information. The memory cell array 1100 includes memory cells, as a storage device, arranged by rows and columns. Each of the memory cells stores single bit data and/or multi bit data (for example, two or more data bits). Each memory cell may be constituted by a memory transistor having a charge storage layer such as a floating gate, a charge trap layer, or the like, a variable resistance, and so on.

As illustrated in FIG. 1, the flash memory device 1000 further includes a row decoder 1200, a voltage generator 1300, a read/write circuit 1400, an input/output circuit 1500, and control logic 1600.

The row decoder 1200 is controlled by the control logic 1600 and selects and drives rows of the memory cell array 1100. The row decoder 1200 is configured to drive rows of the memory cell array 1100 by not only a positive voltage but also a negative voltage. The voltage generator 1300 is controlled by the control logic 1600 and is configured to generate voltages (for example, a program voltage, a read voltage, a negative voltage and so on) to be provided to the memory cell array 1100. The read/write circuit 1400 is controlled by the control logic 1600 and is configured to read data from selected memory cells of the memory cell array 1100 at a read operation. The read/write circuit 1400 is configured to drive columns (or bit lines) of the memory cell array 1100 by a supply voltage (called a bit line program prohibition voltage) or a ground voltage (called a bit line program voltage) according to data to be programmed, respectively. The read/write circuit 1400, although not illustrated in the drawings, includes a page buffer block and a column select block (or a page buffer block, a column select block and a pass/fail check block). The input/output circuit 1500 is controlled by the control logic 1600 and is configured to interface data between the read/write circuit 1400 and an external device (for example, a memory controller). The control logic 1600 is configured to control an overall operation of the flash memory device 1000.

Figure 2:
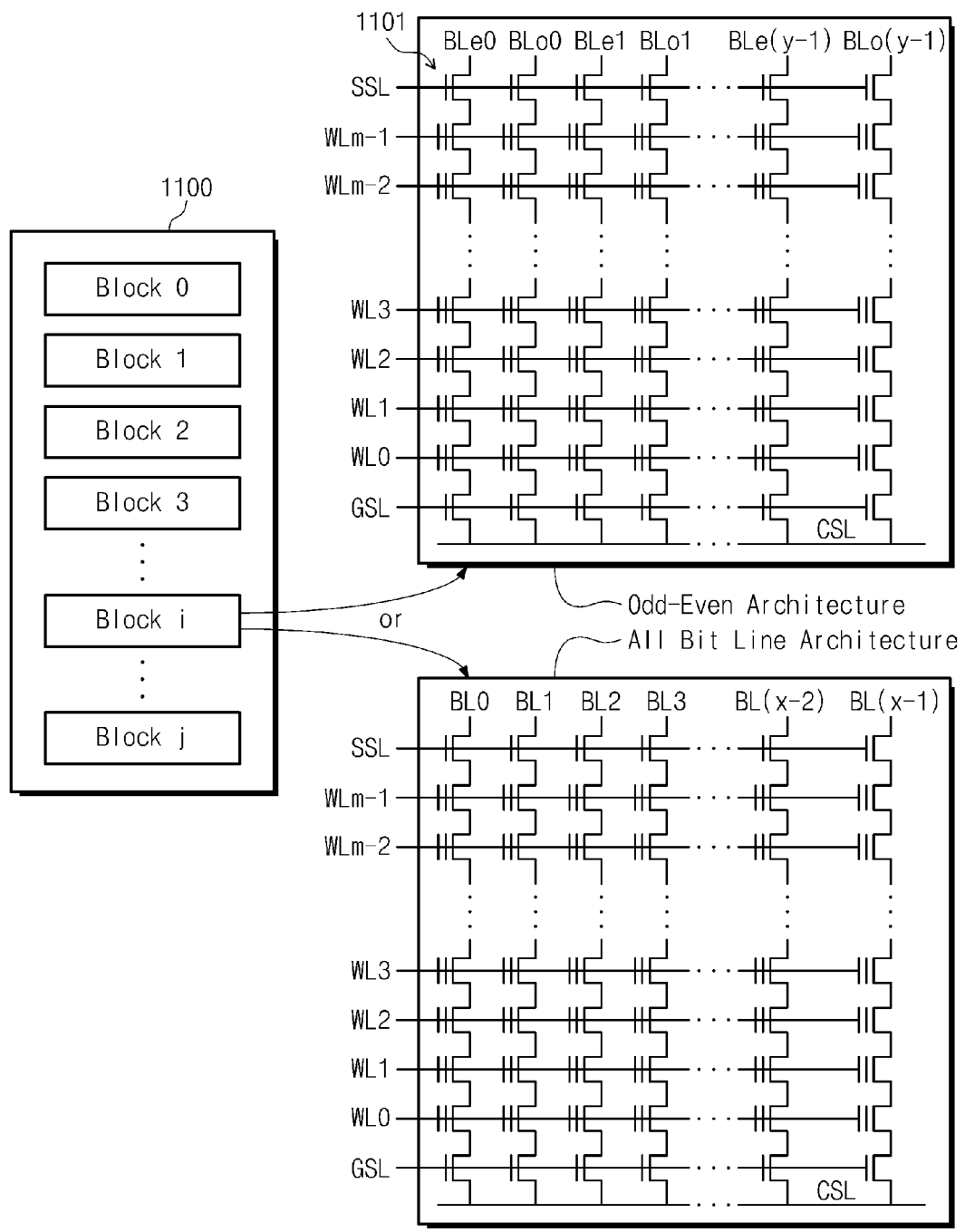
FIG. 2 is a drawing illustrating an example of constituting a memory cell array by memory blocks for all bit line memory architecture or an odd-even memory architecture.

FIG. 2 is a drawing illustrating an example of constituting a memory cell array by memory blocks for all bit line memory architecture or an odd-even memory architecture. Example structures of the memory cell array 1100 will be described. As an example, a NAND flash memory device that the memory cell array 1100 is divided by a plurality of memory blocks, for example, 1024 memory blocks will be described. Data stored in each memory block can be erased at the same time. In an embodiment, a memory block is the smallest unit of storage devices which are erased at the same time. A plurality of columns each corresponding to bit lines (for example, 1 KB bit lines) is in each memory block. In an embodiment called the all bit line architecture, all bit lines of a memory block can be simultaneously selected during read and program operations. Storage devices which belong to a common word line and are connected to all the bit lines can be simultaneously programmed.

In an exemplary embodiment, a plurality of storage devices in the same column is serially connected to constitute a NAND string 1101. One terminal of a NAND string is connected to a corresponding bit line through a select transistor controlled by a string select line (SSL) and the other terminal thereof is connected to a common source line (CSL) through a select transistor controlled by a ground select line (GSL).

In another exemplary embodiment called an odd-even architecture, bit lines are divided into even bit lines (BLe) and odd bit lines (BLo). In the odd-even bit line architecture, storage devices which belong to a common word line and are connected to odd bit lines are programmed at first time while storage devices which belong to a common word line and are connected to even bit lines are programmed at second time. Data may be programmed into other memory blocks and may be read from other memory blocks. These operations may be simultaneously performed.

In an exemplary embodiment, memory blocks of a memory cell array may be arranged to have a two-dimensional array structure or a three-dimensional array structure.

In FIG. 2, at least one of memory blocks constituting the memory cell array 1100 may be a block to store data which needs a security. Hereinafter, such a block is called a security block and remaining blocks except the security block are called a user block to store user data. It may be well comprehended that the memory cell array 1100 further includes a block (called a meta block) required to manage a flash memory device and/or to manage files stored in a flash memory device. Security data of a flash memory device (for example, a serial number of manufacturing company, the data of manufacture, and so on), that is, data requiring a security will be stored in a security block. Even though accompanying an increase in a size of a security block, a security block may be used to store customer data according to a request of a customer. Data stored in a security block has to be securely protected.

Just like user blocks where M-bit data (M is two or more than two) is stored in each memory cell, memory cells of a security block may also store M-bit data. A method of storing M-bit data (M is two or more than two) in each memory cell is called a multi-bit cell (MLC) program method and a method of storing single bit data in each memory cell is called a single-bit cell (SLC) program method. Reliability of security data can be obtained by applying an SLC program method to a security block. On the contrary, as the amount of security data increases, the number of security blocks may increase. In this case, if an MLC program method is applied to a security block, the number of security blocks may be reduced. As well known, if memory cells of a security block are programmed by the MLC program method, margins between threshold voltage distributions (or states) become reduced. Decrease in the margins bring about data loss due to threshold voltage variations (for example, charge loss and charge acquisition) caused by various causes. The threshold voltage variation/charge loss may be affected from data pattern of adjacent memory cells. In the case of a flash memory device in accordance with an exemplary embodiment of the present inventive concept, is in a security block applied a program scheme by which security data in a security block is prevented from being lost due to the charge loss causing reliability deterioration. That program scheme will be described in detail later. Also, instead of an MLC program method, an SLC program method may be applied to a security block.

Figure 3:
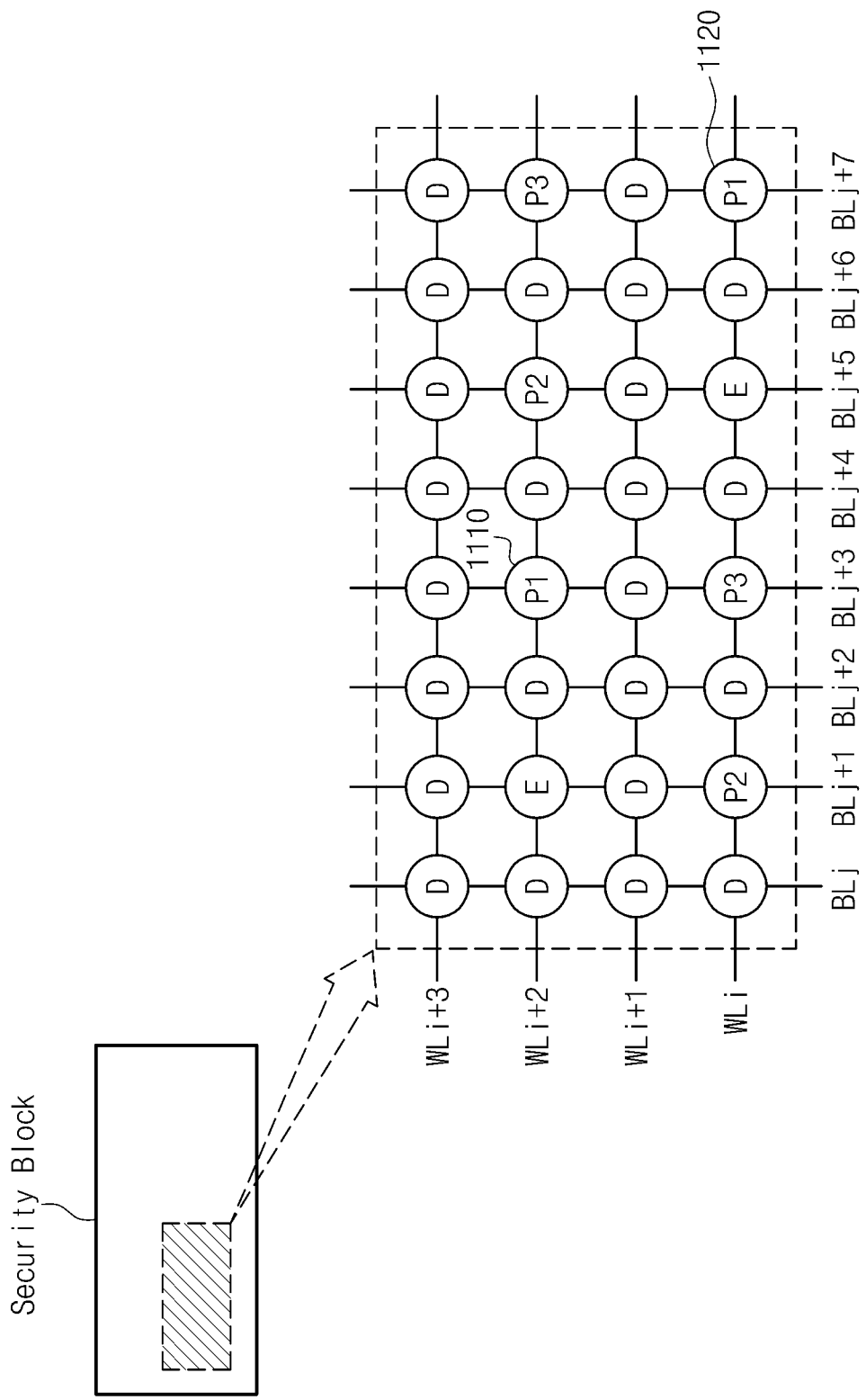
FIG. 3 is a drawing for describing a program method of a security block in accordance with an exemplary embodiment of the present inventive concept.
Figure 4:
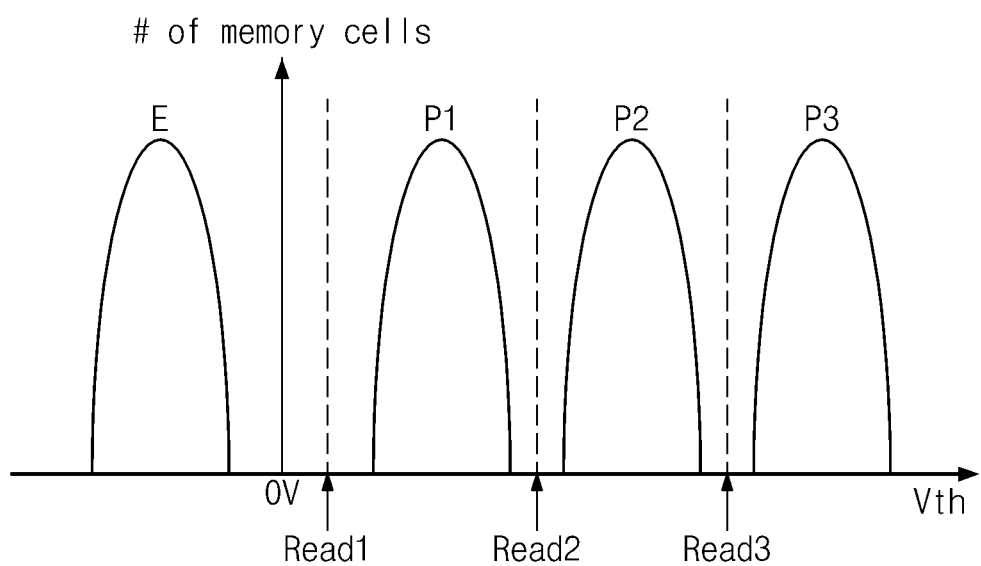
FIG. 4 is a drawing illustrating threshold voltage states when two-bit data is stored in each memory cell.

FIG. 3 is a drawing for describing a program method of a security block in accordance with an exemplary embodiment of the present inventive concept. FIG. 4 is a drawing illustrating threshold voltage states when two-bit data is stored in each memory cell.

In FIG. 3, there is illustrated a program pattern with respect to memory cells which belong to a portion (corresponding to a block indicated by a dotted line) of a security block. The rest of the memory cells in the security block will be programmed by the same method as that illustrated in FIG. 3.

In FIG. 3, 'D' represents dummy data, 'E' represents an erase state and 'P1', 'P2' and 'P3' represent a program state, respectively. In FIG. 4, distributions of threshold voltages of the erase and program states E, P1, P2, and P3 are illustrated. In an exemplary embodiment of the present inventive concept, memory cells storing dummy data D are programmed so as to have any one of the program states P1, P2, and P3. For example, memory cells storing dummy data D are programmed so as to have the highest program state P3. Alternatively, memory cells storing dummy data D are programmed so as to have the program state P2. Still alternatively, memory cells storing dummy data D are programmed so as to have the program state P1. On the other hand, memory cells storing dummy data D may be programmed so as to have the erase state E. A method of programming M-bit data (M is two or greater integer) may be variously embodied. A security block of the present inventive concept is not limited to any one program method. Exemplary MLC program methods are disclosed in U.S. publication patent No. 2008-0144370 and U.S. publication patent No. 2008-0059835, the entire contents of which are hereby incorporated by reference. An MLC program method applied to the present inventive concept may not be limited to those disclosed in these patents.

In FIG. 3, data stored in memory cells respectively corresponding to the states P1, P2, and P3 constitute security data and the dummy data D will not be included in security data. As illustrated in FIG. 3, each of memory cells storing security data (indicated by E, P1, P2 or P3) is surrounded by memory cells storing dummy data D corresponding to any one of the program states P1, P2, and P3. For example, memory cells storing security data (indicated by E, P1, P2 or P3) are arranged to be adjacent to one another in a row direction, a column direction and a diagonal direction and are surrounded by memory cells storing dummy data D. Security data can be stored in a security block on a wafer level or a package level.

According to the above-described security data pattern, each of memory cells storing security data may experience the same influence from adjacent memory cells (arranged to be adjacent to one another in a row direction, a column direction and a diagonal direction). For example, a memory cell having an erase state is surrounded by memory cells having the same state (for example, corresponding to any one of P1, P2 and P3) regardless of its physical location. This means that each of states of memory cells storing security data undergoes the same threshold voltage change (for example, charge loss) due to the influence from adjacent memory cells regardless of a physical location. That is, a potential difference (corresponding to each direction) generated between a memory cell (e.g., 1110) storing security data and an adjacent memory cell storing dummy data is identical to a potential difference (corresponding to each direction) generated between a memory cell (e.g., 1120) storing security data and an adjacent memory cell storing dummy data regardless of a physical location. Like the state P1, remaining states E, P2, and P3 also undergoe the same threshold voltage change (for example, charge loss) regardless of their physical locations. In the case of programming security data by an MLC program method, as described above, loss of security data may be prevented by constituting a security data pattern so that memory cells storing security data are surrounded by memory cells storing dummy data.

Figure 5:
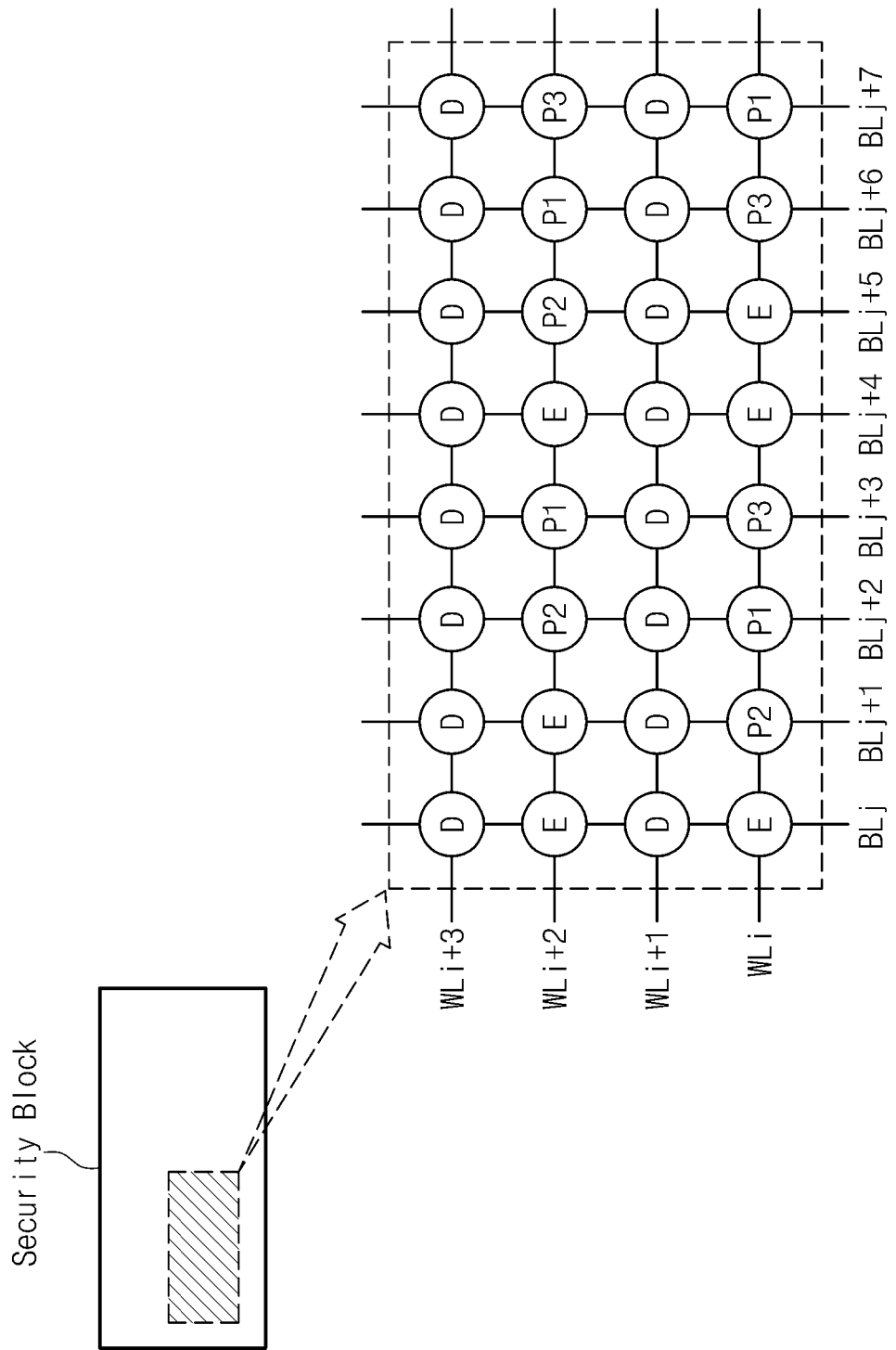
FIGS. 5 and 6 are drawings for describing a program method of a security block in accordance with other exemplary embodiments of the present inventive concept.
Figure 6:
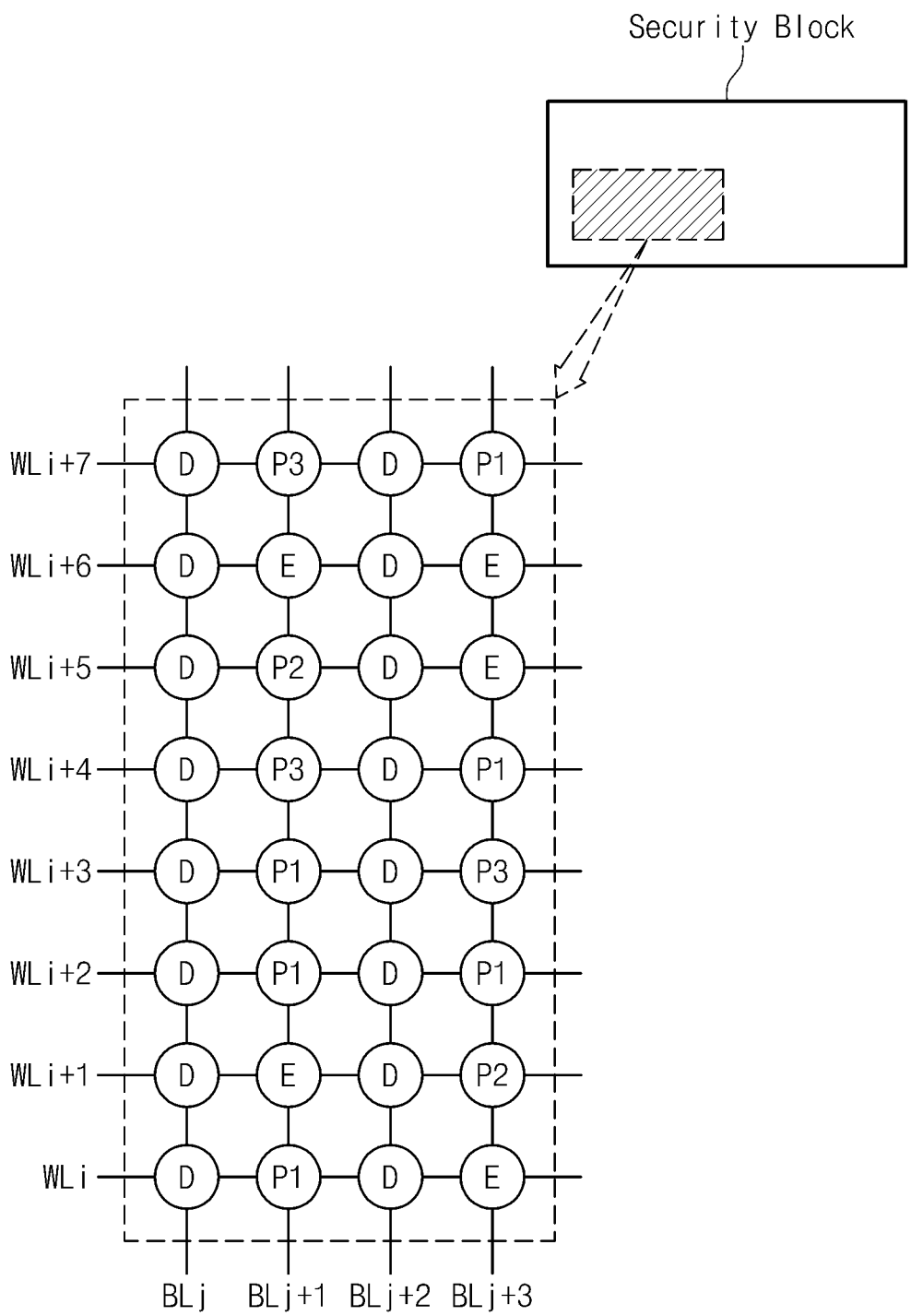

FIGS. 5 and 6 are drawings for describing a program method of a security block in accordance with other exemplary embodiments of the present inventive concept.

First, referring to FIG. 5, a security data pattern may be realized so that a row (for example, WLi+2) of memory cells storing security data E, P1, P2 or P3 is disposed between rows (for example, WLi+1, WLi+3) of memory cells storing dummy data and that security data E, P1, P2 or P3 is stored in memory cells in the same row. Also, as illustrated in FIG. 6, a security data pattern may be realized so that a column (for example, BLj+1) of memory cells storing security data E, P1, P2 or P3 is disposed between columns of memory cells storing dummy data and that security data E, P1, P2 or P3 is stored in memory cells in the same column.

Figure 7:
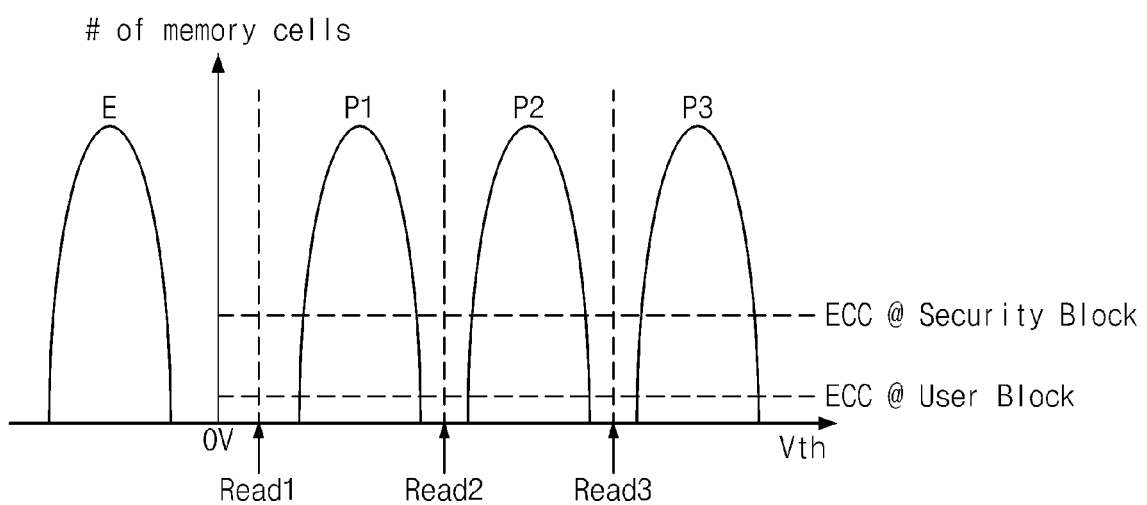
FIG. 7 is a drawing for describing an error correction ability applied to a flash memory device in accordance with an exemplary embodiment of the present inventive concept.

FIG. 7 is a drawing for describing an error correction ability applied to a flash memory device in accordance with an exemplary embodiment of the present inventive concept.

Error correction ability different from that of user blocks is applied to a security block programmed so as to have the security data pattern described in FIGS. 3, 5 and 6. As illustrated in FIG. 7, error correction ability applied to a security block is set to be higher than error correction ability applied to user blocks. For example, an M-bit error correction code is applied to a security block and an N-bit error correction code (M>N) is applied to user blocks. It is possible to prevent loss of security data by increasing an allowable error bit number. ECC data in security data stored in a security block is stored in a spare area (not illustrated) of the security block, which will be conducted on a wafer level or a package level. ECC data is used to detect and correct an error of security data. ECC data is programmed by any one of an SLC program method and an MLC program method. When ECC data of security data is stored by the MLC program method, ECC data in security data may be programmed to have a data pattern in accordance with the above-described program method.

Figure 8:
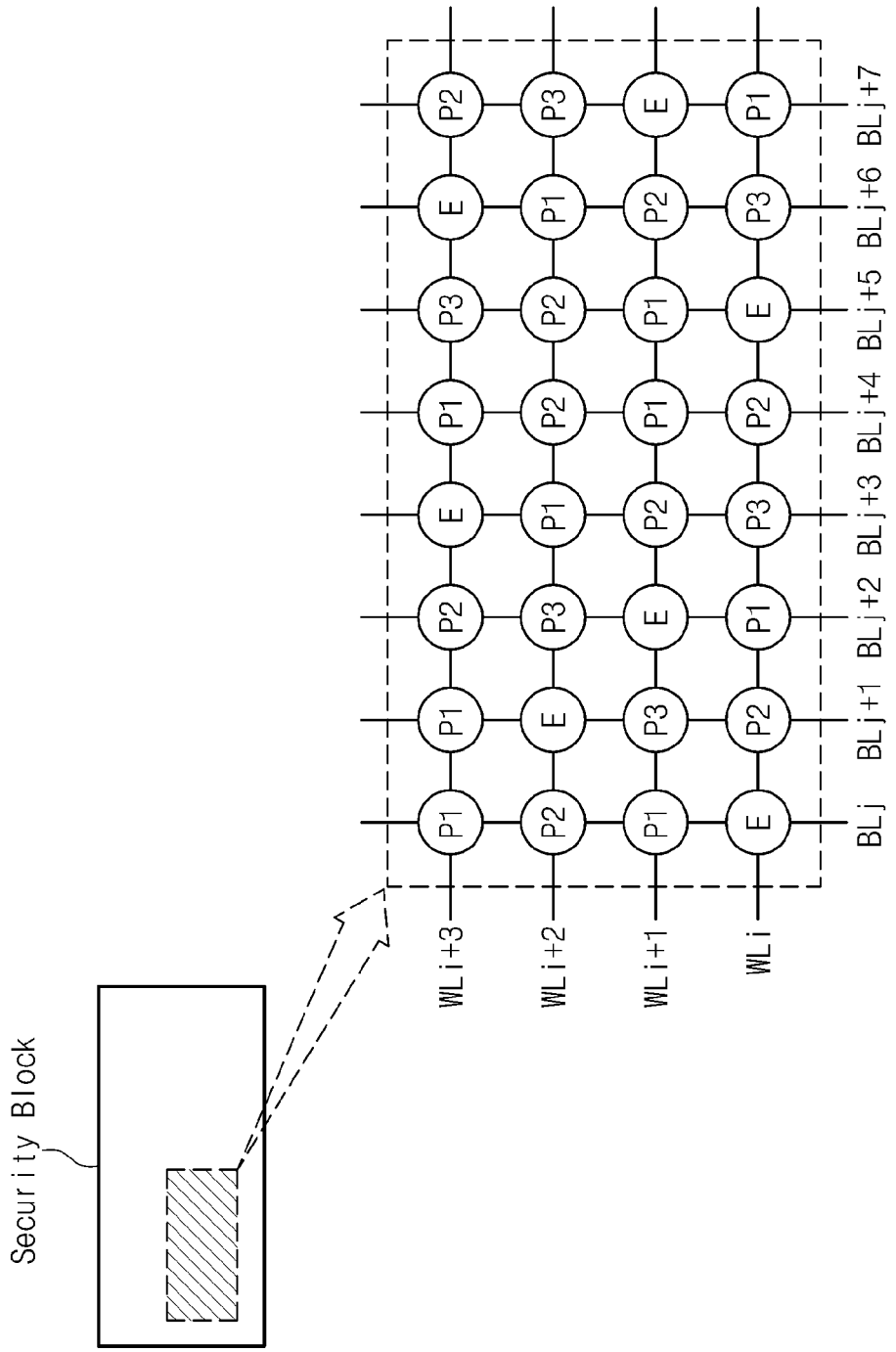
FIG. 8 is a drawing for describing a program method of a security block in accordance with another exemplary embodiment of the present inventive concept.

Unlike the security data pattern described in FIGS. 3, 5 and 6, it is possible to program a security block so as to have a security data pattern illustrated in FIG. 8. In this case, as described in FIG. 7, loss of security data may be prevented by increasing an allowable error bit number. That is, the error correction ability applied to a security block is set to be higher than that applied to user blocks.

Figure 9:
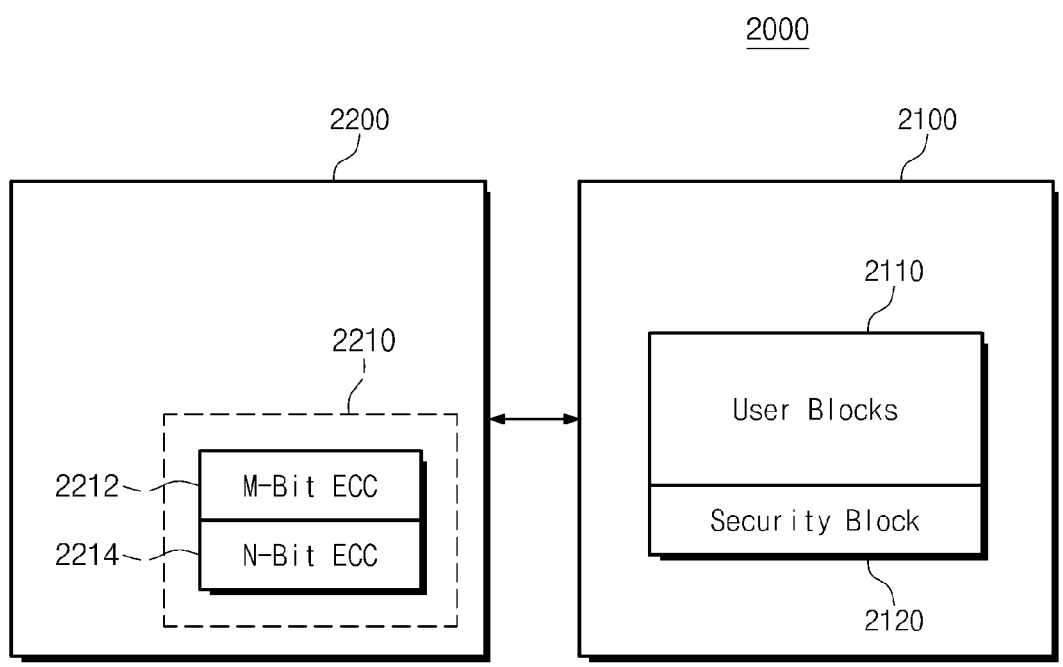
FIG. 9 is a block diagram illustrating a memory system including a flash memory device in accordance with an exemplary embodiment of the present inventive concept.

FIG. 9 is a block diagram illustrating a memory system including a flash memory device in accordance with an exemplary embodiment of the present inventive concept.

Referring to FIG. 9, a memory system 2000 includes a flash memory device 2100 as a nonvolatile memory device and a controller 2200. A memory cell array including user blocks 2110 and a security block 2120 is provided to the flash memory device 2100. Security data stored in the security block 2120 is programmed by any one of the methods described in FIGS. 3, 5, 6 and 8 and description thereof will be thus omitted. The controller 2200 includes an ECC unit 2210 configured to detect and correct an error of data read from the flash memory device 2100. The ECC unit 2210 includes an M-bit ECC unit 2212 and an N-bit ECC unit 2214. The M-bit ECC unit 2212 is used to detect and correct an error of data read from the security block 2120 and the N-bit ECC unit 2214 is used to detect and correct an error of data read from the user blocks 2110.

Although not illustrated in the drawings, an ECC unit having the same error correction ability may be applied to the user blocks 2110 and the security block 2120.

Figure 10:
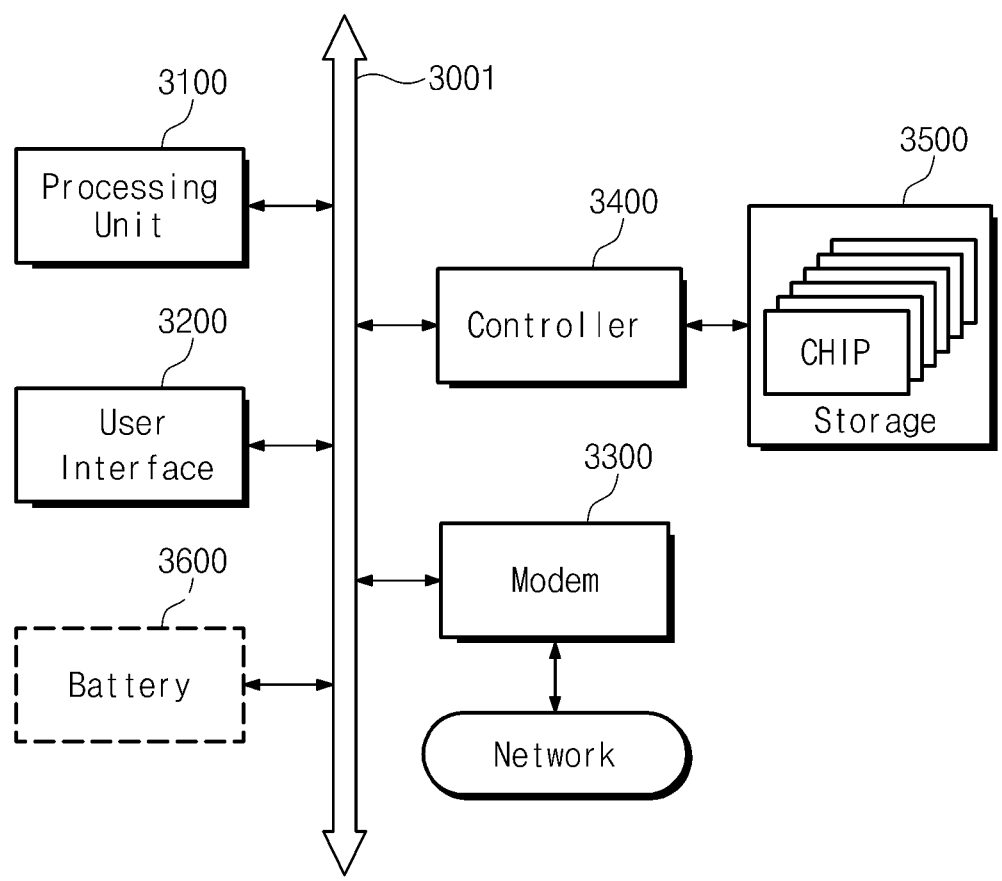
FIG. 10 is a block diagram illustrating a computing system including a flash memory device in accordance with an exemplary embodiment of the present inventive concept.

A flash memory device is a nonvolatile memory device even which can retain its stored data even when its power supply is interrupted. As the use of mobile devices such as a cellular phone, PDA, a digital camera, a portable game consol and MP3P increases, a flash memory device is widely used not only as data storage but also as code storage. A flash memory device may also be used in home applications such as HDTV, DVD, a router and GPS. A computing system including a flash memory device in accordance with an exemplary embodiment of the present inventive concept is illustrated in FIG. 10.

A computing system in accordance with the present inventive concept includes a microprocessor 3100, a user interface 3200, a modem 3300 like a baseband chipset, a controller 3400, which are electrically connected to a bus 3001, and a storage media 3500 comprised of flash memories. The modem 3300 is connected to a network through a wire or a wireless. Each of flash memories of the storage media 3500 is constituted to be identical to that illustrated in FIG. 1. A security data pattern programmed according to the program scheme described above is stored in a security block of a flash memory device. N-bit data (N is 1 or an integer greater than 1) processed/to be processed by the microprocessor 3100 is stored in the storage media 3500 through the controller 3400. In the case that the computing system in accordance with the present inventive concept is a mobile device, a battery 3600 for providing an operating voltage of the computing system may further be provided. Although not illustrated in the drawings, an application chipset, a camera image processor (CIS), a mobile DRAM, and the like may further be provided to the computing system in accordance with the present inventive concept.

In an exemplary embodiment, the controller 3400 and the storage media 3500 may constitute a solid state drive (SSD), a memory card or the like.

A flash memory device and/or a controller may be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

In an exemplary embodiment of the present inventive concept, memory cells may be constituted using one of various cell structures each having a charge storage layer. A cell structure having a charge storage layer may include a charge trap flash structure using a charge trap layer, a stack flash structure in which a plurality of arrays are stacked, a source-drain free flash structure, a pin type flash structure and so on. When the program scheme described above is applied to a flash memory device using a charge trap layer as a charge storage layer, it is possible to reduce charge loss due to lateral spreading of electrons.

A memory device having a charge trap flash structure as a charge storage layer is disclosed in U.S. Pat. No. 6,858,906, U.S. publication patent No. 2004-0169238 and U.S. publication patent No. 2006-0180851, the entire contents of which are hereby incorporated by reference. A source-drain free flash structure is disclosed in K.R. patent No. 673020, the entire contents of which are hereby incorporated by reference.

Figure 11:
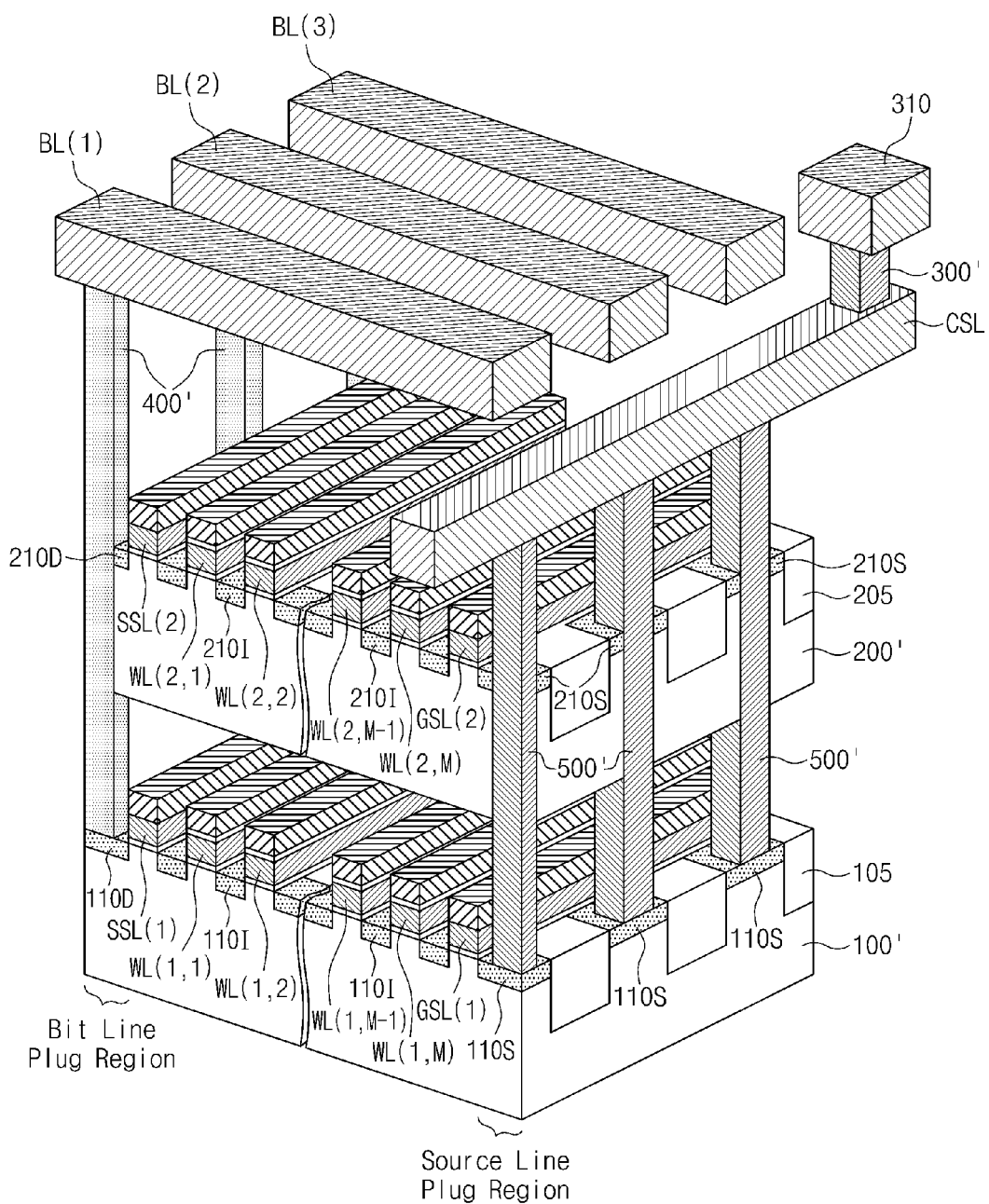
FIGS. 11 through 14 are drawings illustrating a flash structure applied to a flash memory device in accordance with an exemplary embodiment of the present inventive concept.

Referring to FIG. 11 illustrating a stack flash structure, a flash memory device in accordance with the present inventive concept includes memory cells arranged in three dimensions. Memory cells include a plurality of laminated semiconductor layers used as a semiconductor substrate to form a MOS transistor. For convenience of description, in FIG. 11, only two semiconductor layers (i.e., a first semiconductor layer 100' and a second semiconductor layer 200') are illustrated, but the number of semiconductor layers may be more than two.

According to an embodiment of the present inventive concept, the first semiconductor layer 100' may be a single crystalline wafer and the second semiconductor layer 200' may be a single crystalline silicon epitaxial layer formed through an epitaxial process using the first semiconductor layer 100' (i.e., wafer) as a seed layer. K.R. publication patent No. 2004-97003 discloses a method of forming an epitaxial semiconductor layer on a semiconductor wafer using an epitaxial process and the method may be used for embodiments of the present inventive concept.

According to embodiments of the present inventive concept, each of the semiconductor layers 100' and 200' includes a cell array having substantially a same structure. The memory cells in consequence constitute multilayer cell arrays. To reduce a complication of description by a multilayer arrangement, a notation simply representing each of elements of the cell arrays such as a gate structure, a common source line (CSL), bit-line plugs and impurity regions and so on will be first defined. To simply represent a vertical location of each of elements, the order of a semiconductor layer on which the element is disposed is marked in a round bracket written behind the name of the element. For example, GSL(1) and SSL(2) represent a ground select line formed on the first semiconductor layer 100' and a string select line formed on the second semiconductor layer 200' respectively.

Each of the semiconductor layers 100' and 200' includes active regions defined by the well known device isolation layer patterns 105 and 205. The active regions are formed in parallel along a specific direction. The device isolation layer patterns 105 and 205 are formed of an insulating material including a silicon oxide layer and electrically isolate the active regions.

On a top of each of the semiconductor layers 100' and 200', a gate structure comprised of a pair of select lines GSL and SSL and M word lines WL crossing the active regions is disposed. Source plugs 500' are disposed on one side of the gate structure and bit line plugs 400' are disposed on the other side of the gate structure. The bit line plugs 400' are connected to N bit lines crossing the word lines WL, respectively. At this time, the bit lines BL are formed to cross word lines WL on an upper portion of the top semiconductor layer (e.g., the second semiconductor layer 200' of FIG. 11). The number N of the bit lines BL is an integer greater than 1 and may be one of multiples of 8.

The word lines WL are disposed between the select lines GSL and SSL and M which is the number of the word lines WL constituting one gate structure is an integer greater than 1. The integer M may be one of multiples of 8. One of the select lines GSL and SSL is used as a ground select line GSL controlling an electrical connection between a common source line CSL and memory cells, and the other of the select lines GSL andSSL is used as a string select line SSL controlling an electrical connection between bit lines and memory cells.

Impurity regions are formed in active region between select lines and word lines. At this time, impurity regions 110S and 210S formed on one side of the ground select line GSL are used as source electrodes connected by common source lines CSL(1) and CSL(2) and impurity regions 110D and 210D formed on one side of the string select lines SSL(1), SSL(2) are used as drain electrodes connected to bit lines BL through the bit line plugs 400'. Also, impurity regions 110I and 210I formed on both sides of the word lines WL are used as internal impurity regions serially connecting memory cells.

According to the present inventive concept, the source plugs 500' are formed on the first and second semiconductor layers 100' and 200' to electrically connect the impurity regions 110S and 210S (hereinafter they are referred to as first and second source regions) used as source electrodes to the semiconductor layers 100' and 200'. As a result, the first and second source regions 110S and 210S have the same potential as the semiconductor layers 100' and 200'.

According to an embodiment of the present inventive concept, as described in FIG. 11, for the electrical connection, the source plugs 500' pass through the second semiconductor layer 200' and the second source region 210S to be connected to the first source region 110S. At this time, the source plug 500' is directly in contact with inner walls of the second semiconductor layer 200' and the second source region 210S.

The program method described above may be applied to a flash memory device having a stack flash structure described in FIG. 11.

Figure 12:
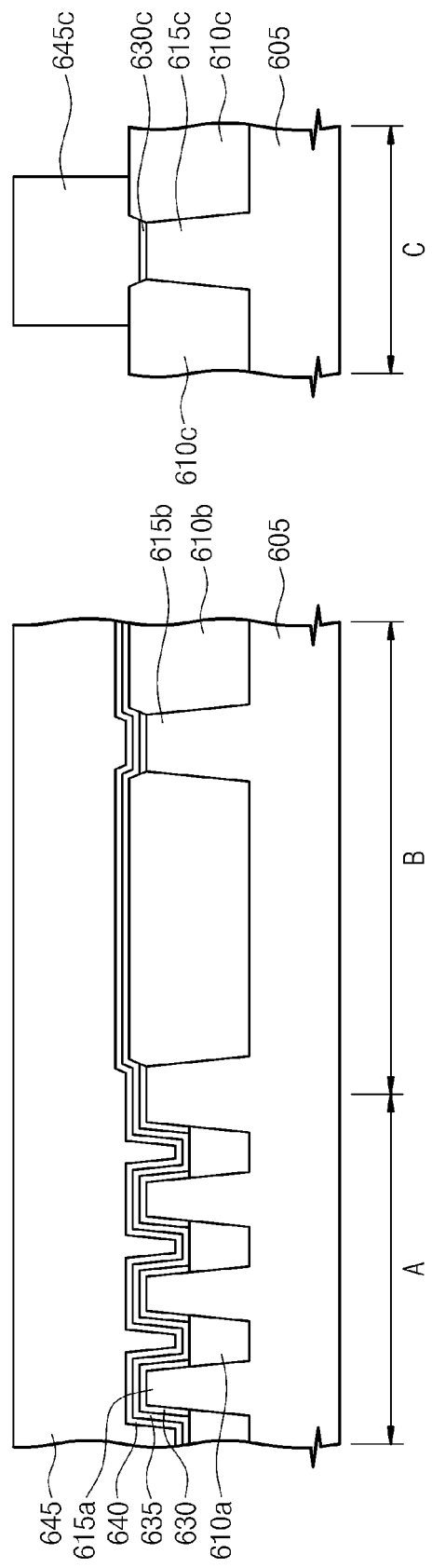

Referring to FIG. 12 illustrating a pin type structure mentioned above, a semiconductor substrate may be defined by a plurality of regions. For example, a semiconductor substrate may be divided into a cell region (A), a peripheral region (C) and a boundary region (B) disposed between the cell region (A) and the peripheral region (C). The cell region (A) may be a region where a memory transistor is formed and the peripheral region (C) may be a region where a peripheral circuit device to control an operation of a memory transistor is formed. The boundary region (B) may be used to be separated from the cell region (A) and the peripheral region (C) but may include edge portions of the cell region (A) and the peripheral region (C).

A first device isolation layer 610a is provided to a first region of a semiconductor substrate, for example, the cell region (A) and second device isolation layers 610b and 610c may be provided to a second region, for example, the boundary region (B) and/or the peripheral region (C). The first device isolation layer 610a may be formed to be recessed by a predetermined depth from a surface of a semiconductor substrate to define a first active region 615a of a pin type. The second device isolation layers 610b and 610c may be provided to be even with a surface of a semiconductor substrate or protrude from a surface of a semiconductor substrate to define second active regions 615b and 615c of a flat type. It was described that the first device isolation layer 610a and the second device isolation layers 610b and 610c have the same depth, but they may have different depths from one another.

Top surface and side surfaces of the first active region 615a are exposed to the first device isolation layer 610a and thereby the first active region 615a may have a three-dimensional shape. On the contrary, only top surfaces of the second active regions 615b and 615c are exposed to the second device isolation layers 610b and 610c and thereby the second active regions 615b and 615c may have one dimensional shape. A recession depth of the first device isolation layer 610a is a factor determining a depth of exposed side surface of the first active region 615a and may be controlled according to a requested characteristic of a device.

A tunnel insulating layer 630, a storage node layer 635, a blocking insulating layer 640 and a control gate electrode 645 may be formed on the cell region (A) or may be provided over the cell region (A) and the boundary region (B). The storage node layer 635 is provided on the tunnel insulating layer 630 and may be provided to extend over the device isolation layers 615a and 615b. The blocking insulating layer 640 is provided on the storage node layer 635 and the control gate electrode 645 may be provided on the blocking insulating layer 640 along a direction crossing the active regions 615a and 615b.

A memory transistor of the cell region (A) has a pin type structure, may use the first active region 615a as a portion of a bit line and may use the control gate electrode 645 as a portion of a word line. Thus, a top surface of the first active region 615a and the vicinity of side surfaces of the first active region 615a may be used as a channel region. A flat type transistor may be provided to the peripheral region (C). For example, a flat type transistor may include a gate insulating layer 630c on the peripheral region (C) and a gate electrode 645c on the gate insulating layer 630c.

The program scheme described above may be applied to the pin type structure illustrated in FIG. 12.

Figure 13:
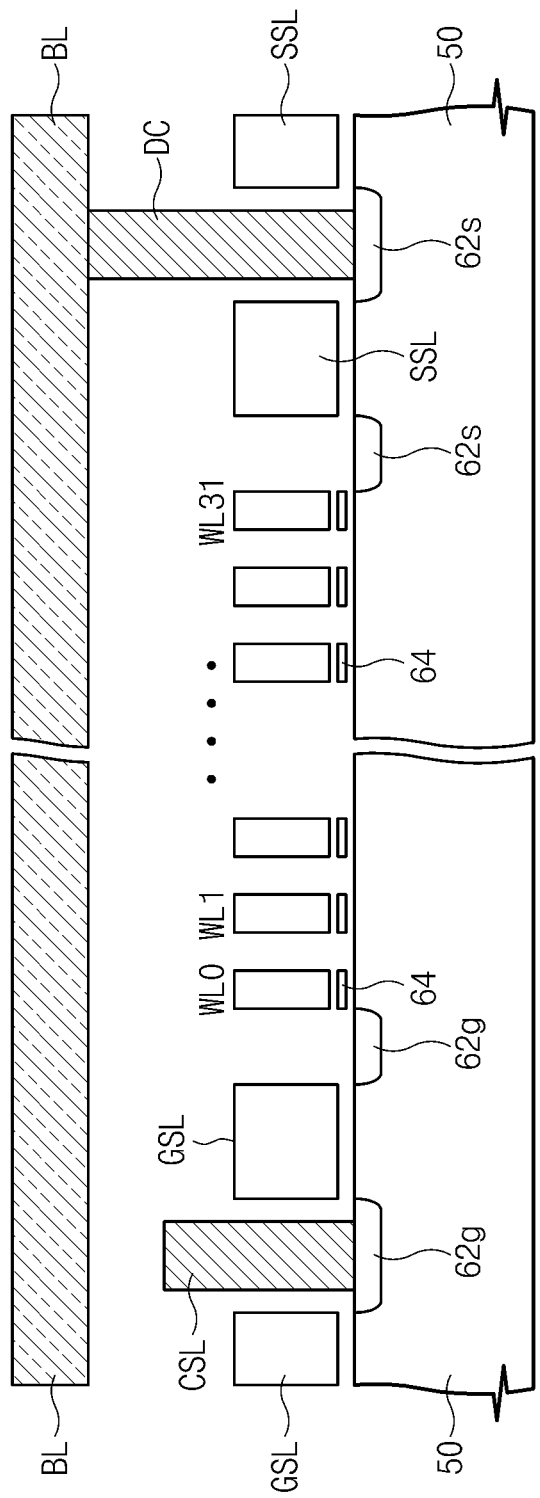

Referring to FIG. 13 illustrating a flash structure without a source/drain, a ground select transistor, a string select transistor and cell transistors are formed on an active region defined in a semiconductor substrate 50. A ground select line (GSL), a string select line (SSL) and word lines (WLn) are formed to cross an upper portion of the active region. Bit lines (BLn) are in contact with a source/drain region formed on one side of the string select line (SSL) through a bit line contact (DC). A cell transistor includes a charge storage layer 64 interposed between a gate electrode and an active region. The charge storage layer 64 may be a floating gate and in a case of a SONOS device, the charge storage layer 64 may be a charge storage insulating layer. Besides, the charge storage layer 64 may be a semiconductor or metal nanocrystal.

A source/drain region 62g formed in an active region of both sides of the ground select line GSL and a source/drain region 62s formed in an active region of both sides of the string select line SSL are a source/drain region of PN junction structure formed of a diffusion layer of an opposite conductivity type with respect to a substrate. A source/drain region between the word lines WL is not a PN junction structure but a field effect source/drain region formed of an inversion layer generated in an active region by fringe field induced by a voltage applied to an adjacent word line. A decrease of an on current due to adoption of a field effect source/drain region can be compensated by forming an active region of a portion where a channel and a source/drain region of a transistor are formed of a layer in which charge mobility is strengthened.

The program scheme described above may be applied to the flash structure without a source/drain illustrated in FIG. 13.

Figure 14:
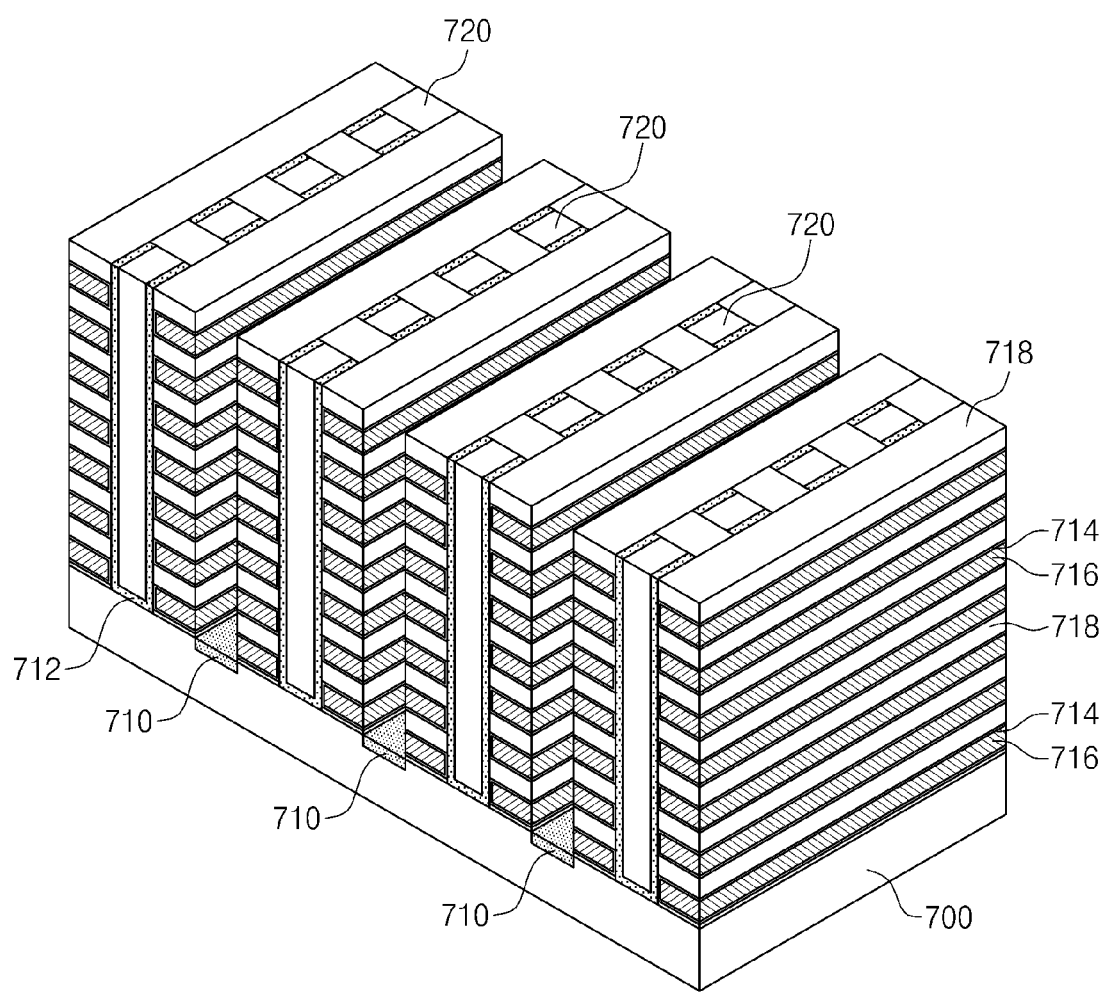

A three-dimensional (3D) array structure may be applied to the flash memory device according to embodiments of the inventive concept, and an exemplary 3D structure is illustrated in FIG. 14. The 3D structure is also called "a vertical NAND (VNAND) structure".

Referring to FIG. 14, a plurality of active patterns 712 is formed to be vertical to a semiconductor substrate 700. The active patterns 712 may be used as active regions of strings. An inner space of each active pattern 712 is filled up with a buried pattern 720. Further, the active patterns 720 are electrically isolated from one another by a buried pattern, respectively. Gate structures are formed at both sides of the respective active patterns 712 as illustrated in FIG. 14. Each of the gate structures is formed of an information storing element 714 and a conductive pattern 716. The gate structures are electrically isolated from one another by an insulation film 718. Herein, the information storing layer 714 is used to accumulate charge, and the conductive pattern 716 is used as a word line. Impurity regions 710 to be used as a common source line are formed at the semiconductor substrate 700.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A flash memory device, comprising:
   a user data area storing user data; and
   a security data area storing security data, wherein the security data area stores a security data pattern in which first groups of memory cells storing security data are arranged between second groups of memory cells storing dummy data, respectively.

2. The flash memory device of claim 1, wherein each of the first groups comprises first memory cells storing security data and second memory cells, the second memory cells being disposed between the first memory cells and storing dummy data.

3. The flash memory device of claim 2, wherein the first and second groups are comprised of a word line.

4. The flash memory device of claim 2, wherein the first and second groups are comprised of a bit line.

5. The flash memory device of claim 2, wherein the security data is two-bit data corresponding to any one of an erase state and a plurality of program states.

6. The flash memory device of claim 5, wherein the dummy data corresponds to one of the plurality of program states.

7. The flash memory device of claim 2, wherein the security data is M-bit data (M being 2 or more integer).

8. The flash memory device of claim 1, wherein an allowable error bit number of the security data area is more than that of the user data region.

9. The flash memory device of claim 1, wherein each of the memory cells comprises a storage element having either one of a floating gate and a charge trap layer, as a charge storage layer.

10. The flash memory device of claim 1, wherein the security data is programmed in either one of a wafer level and a package level.

11. A memory system, comprising:
    a flash memory device including a user data area storing user data and a security data area storing security data, wherein the security data area stores a security data pattern in which first groups of memory cells storing security data are arranged between second groups of memory cells storing dummy data, respectively; and
    a controller including a first error correction unit configured to detect and correct an error of user data stored in the user data area and a second error correction unit configured to detect and correct an error of security data stored in the security data area, wherein an error correction ability of the second error correction unit is greater than an error correction ability of the first error correction unit.

12. The memory system of claim 11, wherein the security data is two-bit data corresponding to one of an erase state and a plurality of program states.

13. The memory system of claim 12, wherein the dummy data corresponds to one of the plurality of program states.

14. A security data program method of a flash memory device, comprising:
    defining a user data area and a security data area; and
    storing a security data pattern in the security data area, wherein the security data area comprises first memory cells storing security data and second memory cells storing dummy data, and the security data pattern is stored in the first memory cells of the security data area so as to be surrounded by the second memory cells.

15. The security data program method of claim 14, wherein the security data is two-bit data corresponding to one of an erase state and a plurality of program states.

16. The security data program method of claim 15, wherein the dummy data corresponds to one of the plurality of program states.

17. The security data program method of claim 14, wherein an allowable error bit number of the security data area is more than that of the user data area.

18. The security data program method of claim 14, wherein each of the memory cells comprises a storage element including one of a floating gate and a charge trap layer, as a charge storage layer.

* * * * *